(12) United States Patent
Wen et al.

(10) Patent No.: US 9,640,405 B2
(45) Date of Patent: May 2, 2017

(54) CHIP PACKAGE HAVING A LASER STOP STRUCTURE

(71) Applicant: XINTEC INC., Taoyuan (TW)

(72) Inventors: Ying-Nan Wen, Hsinchu (TW); Chien-Hung Liu, New Taipei (TW); Shih-Yi Lee, Taoyuan (TW); Ho-Yin Yiu, Hsinchu (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/983,401

(22) Filed: Dec. 29, 2015

(65) Prior Publication Data

US 2016/0190063 A1   Jun. 30, 2016

Related U.S. Application Data

(60) Provisional application No. 62/098,179, filed on Dec. 30, 2014.

(51) Int. Cl.
*H01L 23/00* (2006.01)
*H01L 21/304* (2006.01)
(Continued)

(52) U.S. Cl.
CPC .......... *H01L 21/304* (2013.01); *H01L 21/268* (2013.01); *H01L 21/6835* (2013.01); *H01L 21/76* (2013.01); *H01L 21/76802* (2013.01); *H01L 21/76898* (2013.01); *H01L 21/78* (2013.01); *H01L 23/481* (2013.01); *H01L 23/49827* (2013.01); *H01L 2221/68327* (2013.01); *H01L 2224/13* (2013.01); *H01L 2225/06541* (2013.01); *H01L 2924/0002* (2013.01)

(58) Field of Classification Search
CPC ............. H01L 23/49827; H01L 23/481; H01L 2225/06541
See application file for complete search history.

(56) References Cited

U.S. PATENT DOCUMENTS

| 6,222,276 | B1 * | 4/2001 | Bertin | ..................... H01L 23/13 257/713 |
| 6,410,431 | B2 * | 6/2002 | Bertin | ..................... H01L 21/44 257/E23.004 |

(Continued)

FOREIGN PATENT DOCUMENTS

TW           201044500       12/2010

*Primary Examiner* — Ngan Ngo
(74) *Attorney, Agent, or Firm* — Liu & Liu

(57) ABSTRACT

A chip package included a chip, a first though hole, a laser stop structure, a first isolation layer, a second though hole and a conductive layer. The first though hole is extended from the second surface to the first surface of the chip to expose a conductive pad, and the laser stop structure is disposed on the conductive pad exposed by the first through hole, which an upper surface of the laser stop structure is above the second surface. The first isolation layer covers the second surface and the laser stop structure, and the first isolation layer has a third surface opposite to the second surface. The second though hole is extended from the third surface to the second surface to expose the laser stop structure, and a conductive layer is on the third surface and extended into the second though hole to contact the laser stop structure.

10 Claims, 22 Drawing Sheets

(51) Int. Cl.
*H01L 21/76* (2006.01)
*H01L 21/78* (2006.01)
*H01L 21/683* (2006.01)
*H01L 21/268* (2006.01)
*H01L 21/768* (2006.01)
*H01L 23/498* (2006.01)
*H01L 23/48* (2006.01)

(56) References Cited

U.S. PATENT DOCUMENTS

| | | | |
|---|---|---|---|
| 2009/0134528 A1* | 5/2009 | Lee | H01L 21/486 257/777 |
| 2010/0029045 A1* | 2/2010 | Ramanathan | H01L 21/565 438/114 |
| 2012/0104625 A1* | 5/2012 | Park | H01L 24/19 257/774 |
| 2012/0168792 A1* | 7/2012 | Kang | H01L 33/486 257/94 |
| 2013/0328147 A1* | 12/2013 | Ho | H01L 31/02002 257/432 |
| 2015/0235936 A1* | 8/2015 | Yu | H01L 23/49816 257/738 |
| 2015/0235989 A1* | 8/2015 | Yu | H01L 25/50 257/712 |
| 2016/0133544 A1* | 5/2016 | Liu | H01L 23/481 257/774 |
| 2016/0133588 A1* | 5/2016 | Yiu | H01L 24/09 257/737 |

* cited by examiner

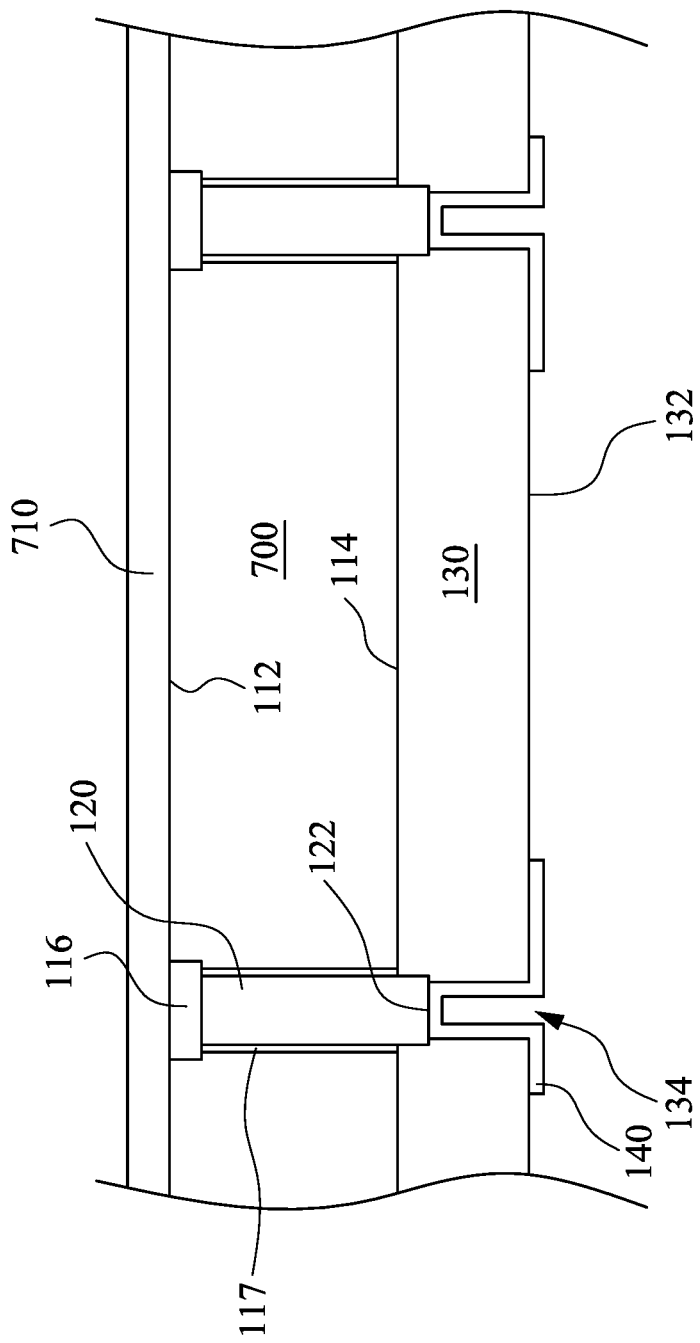

CHIP PACKAGE HAVING A LASER STOP STRUCTURE

RELATED APPLICATIONS

This application claims priority to U.S. provisional Application Ser. No. 62/098,179, filed Dec. 30, 2014, which is herein incorporated by reference.

BACKGROUND

Field of Invention

The present invention relates to a chip package and fabrication method thereof.

Description of Related Art

The finger print sensor and the RF (radio frequency) sensor require the use of a flat sensing surface to detect a signal, and the detecting accuracy of these sensing devices is reduced if the sensing surface is not flat. For example, a finger is pressed against the sensing surface of the finger print sensor. If the sensing surface is not flat, it will be difficult to detect complete fingerprint.

In addition, a through silicon via (TSV) is formed in a wafer to expose a pad from the TSV in the fabrication of the above sensing devices. Then, a chemical vapor deposition (CVD) process is applied to form an isolation layer on the pad and on the sidewalls of the TSV. After that, a patterning process is applied to form an opening in the isolation layer to expose the pad. Generally, the patterning process includes exposing, developing and etching processes. In the subsequent process, a redistribution layer is formed on the isolation layer and electrically connected to the pad exposed by the opening of the isolation layer.

However, the CVD and patterning processes are required to spend a lot process time and machine costs.

SUMMARY

The present disclosure provides a chip package including a chip, a first though hole, a laser stop structure, a first isolation layer, a second though hole and a conductive layer. The chip has a conductive pad, a first surface and a second surface opposite to the first surface, and the conductive pad is on the first surface. The first though hole is extended from the second surface to the first surface to expose the conductive pad, and the laser stop structure is disposed on the conductive pad exposed by the first through hole, which an upper surface of the laser stop structure is above the second surface. The first isolation layer covers the second surface and the laser stop structure, and the first isolation layer has a third surface opposite to the second surface. The second though hole is extended from the third surface to the second surface to expose the laser stop structure, and a conductive layer is on the third surface and extended into the second though hole to contact the laser stop structure.

In various embodiments of the present disclosure, the chip package further includes a passivation layer and an external conductive connection. The passivation layer covers the third surface and the conductive layer, and the passivation layer has an opening exposing the conductive layer. The external conductive connection is in the opening and in contact with the conductive layer.

In various embodiments of the present disclosure, a hole diameter of the second through hole is less than a hole diameter of the first through hole.

In various embodiments of the present disclosure, the second through hole only exposes the laser stop structure.

In various embodiments of the present disclosure, the laser stop structure is a solid structure or a hollow structure.

In various embodiments of the present disclosure, a sidewall and a bottom of the second though hole are rough surfaces.

In various embodiments of the present disclosure, the laser stop structure includes copper.

In various embodiments of the present disclosure, the first isolation layer includes epoxy.

In various embodiments of the present disclosure, a thickness of the conductive layer on the third surface of the first isolation layer is greater than a thickness of the conductive layer on a sidewall of the second through hole.

In various embodiments of the present disclosure, a thickness of the conductive layer on a sidewall of the second through hole is greater than a thickness of the conductive layer on the laser stop structure.

The present disclosure provides a method of fabricating a chip package, and the method includes following steps. A wafer and a support body temporarily bonded to the wafer are provides, and the wafer includes a first surface and a second surface opposite to the first surface, a conductive pad on the first surface, and a laser stop structure on the conductive pad of the wafer, which the support body covers the first surface and the conductive pad. The wafer is polished to protrude the laser stop structure from the second surface; and a first isolation layer is formed on the second surface to cover the laser stop structure, which the first isolation layer has a third surface opposite to the second surface. A laser is applied to remove a portion of the first isolation layer to form a second though hole, and the laser is stopped at the laser stop structure. A conductive layer is formed on the third surface and on the laser stop structure exposed by the second though hole.

In various embodiments of the present disclosure, the method further includes following steps. A passivation layer is formed to cover the third surface of the first isolation layer and the conductive layer, and the passivation layer is patterned to form an opening exposing the conductive layer.

In various embodiments of the present disclosure, the method further includes forming an external conductive connection in the opening, and the external conductive connection is in contact with the conductive layer.

In various embodiments of the present disclosure, the method further includes following steps. The support body is removed, and the wafer, the first isolation layer and the passivation layer are diced along a scribe line to form the chip package.

In various embodiments of the present disclosure, the laser is aligned to the laser stop structure to remove the portion of the first isolation layer.

In various embodiments of the present disclosure, providing the wafer includes following steps. A first through hole is formed to extend from the second surface to the first surface to expose the conductive pad, and the laser stop structure is formed in the first through hole, and the laser stop structure is on the conductive pad.

In various embodiments of the present disclosure, the laser stop structure is formed in the first through hole by electroplating.

In various embodiments of the present disclosure, the first isolation layer is formed on the second surface by printing or coating.

In various embodiments of the present disclosure, further comprising following steps. The third surface of the first isolation layer is coated, imprinted, molded or polished after forming the first isolation layer on the second surface.

BRIEF DESCRIPTION OF THE DRAWINGS

The invention can be more fully understood by reading the following detailed description of the embodiment, with reference made to the accompanying drawings as follows:

FIGS. 7A to 7G are cross-sectional views of the chip package in FIG. 2 at intermediate stages of fabrication, in accordance with various embodiments;

DETAILED DESCRIPTION

Figure 1:
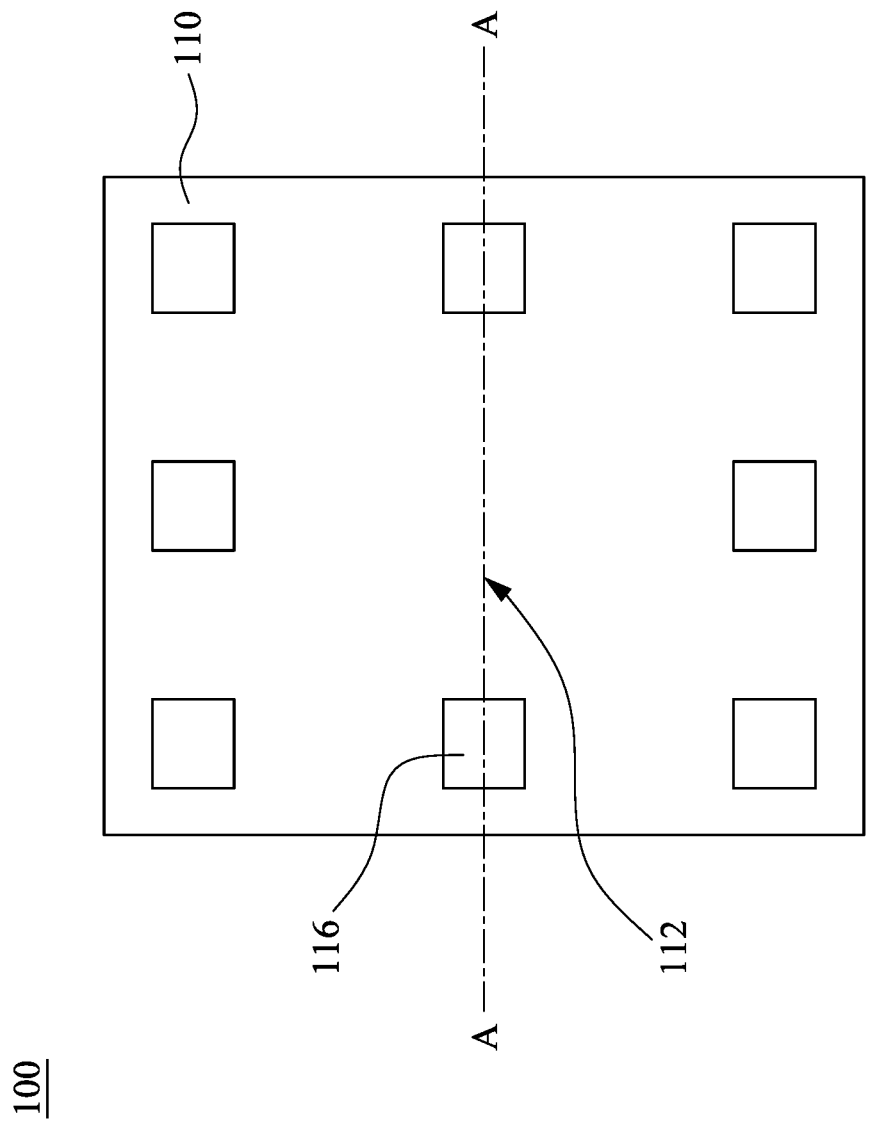
FIG. 1 illustrates a top view of a chip package according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
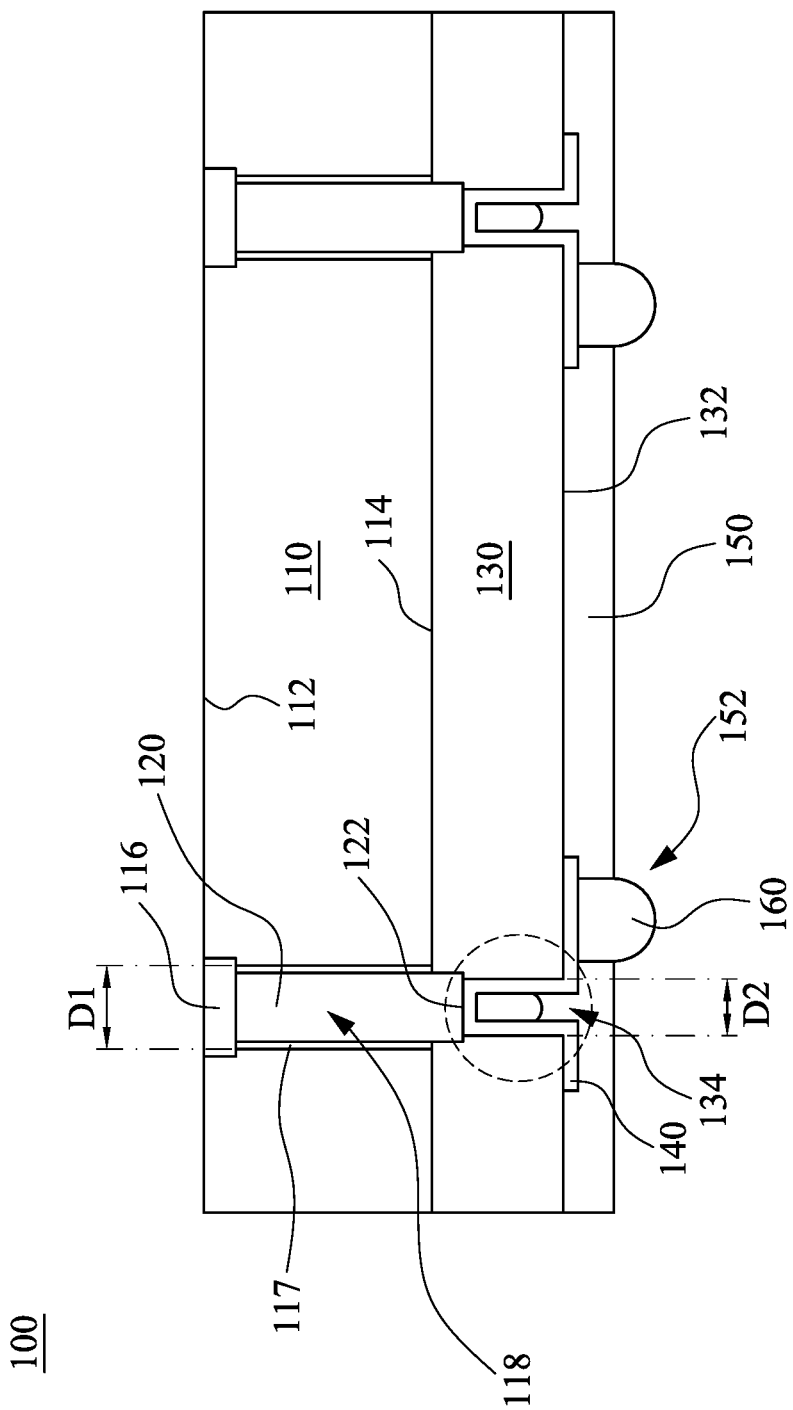
FIG. 2 illustrates a cross-sectional view of the chip package in FIG. 1 along the line A-A.

FIG. 1 illustrates a top view of a chip package according to various embodiments of the present disclosure, and FIG. 2 illustrates a cross-sectional view of the chip package in FIG. 1 along the line A-A. Refer to FIG. 1 and FIG. 2 at the same time. A chip package 100 includes a chip 110, a laser stop structure 120, a first isolation layer 130, a conductive layer 140, a passivation layer 150 and an external conductive connection 160. The chip 110 is a sensor chip having a first surface 112 and a second surface 114 opposite to the first surface 112, which the first surface 112 acts as a sensing surface, and a conductive pad 116 is on the first surface 112 of the chip 110. In some embodiments, the chip 110 is formed of silicon, germanium or group III-V compounds, but not limited thereto. In addition, the second surface 114 of the chip 110 has a first through hole 118 extending from the second surface 114 to the first surface 112 to expose the conductive pad 116. The laser stop structure 120 is in the first through hole 118 and on the conductive pad 116, and an upper surface 122 of the laser stop structure 120 is above the second surface 114. In some embodiments, the laser stop structure 120 is a solid structure, which means that the first through hole 118 is fully filled by the laser stop structure 120. In some embodiments, the chip package 100 further includes a second isolation layer 117, which is disposed in the first through hole 118 to surround the laser stop structure 120. In various embodiments, the second isolation layer 117 includes silicon oxide, silicon nitride, silicon oxynitride or other suitable insulating materials.

Continuing in FIG. 1 and FIG. 2, the first isolation layer 130 is on the second surface 114 to cover the laser stop structure 120, which the first isolation layer 130 includes epoxy. The first isolation layer 130 has a third surface 132 opposite to the second surface 114, and a second though hole 134 is extended from the third surface 132 to the second surface 114 to expose the laser stop structure 120. The second though hole 134 is a laser through hole. Specifically, a laser is applied for penetrating the first isolation layer 130 to form the second through hole 134, and the laser stop structure 120 acts as a terminal of the laser. By applying the laser, a hole diameter D2 of the second through hole 134 is less than the hole diameter D1 of the first through hole 118, and it is benefit for miniaturization design. In some embodiments, the second through hole 134 only exposes the laser stop structure 120. In various embodiments, the material of the laser stop structure 120 is selected from a conductive material able to block the laser, such as copper.

Continuing in FIG. 1 and FIG. 2, the conductive layer 140 is on the third surface 132 of the first isolation layer 130, and a portion of the conductive layer 140 is extended into the second through hole 134 to contact the laser stop structure 120, which is exposed by the second through hole 134. The passivation layer 150 covers the third surface 132 and the conductive layer 140, and the passivation layer 150 has an opening 152 exposing the conductive layer 140. In addition, the external conductive connection 160 is in the opening 152 and in contact with the conductive layer 140. Therefore, the external conductive connection 160 is electrically connected to the conductive pad 116 via the conductive layer 140 and the laser stop structure 120.

In some embodiments, the external conductive connection 160 includes a solder ball, a bump or other well-known structures in the industry, and a shape of the external conductive connection 160 includes spherical, oval, square or rectangular, but not limited thereto. In various embodiments, the conductive layer 140 includes conductive materials, such as copper.

In some embodiments, the chip package 100 is a finger print sensor or a RF sensor, but not limited thereto.

Figure 3:
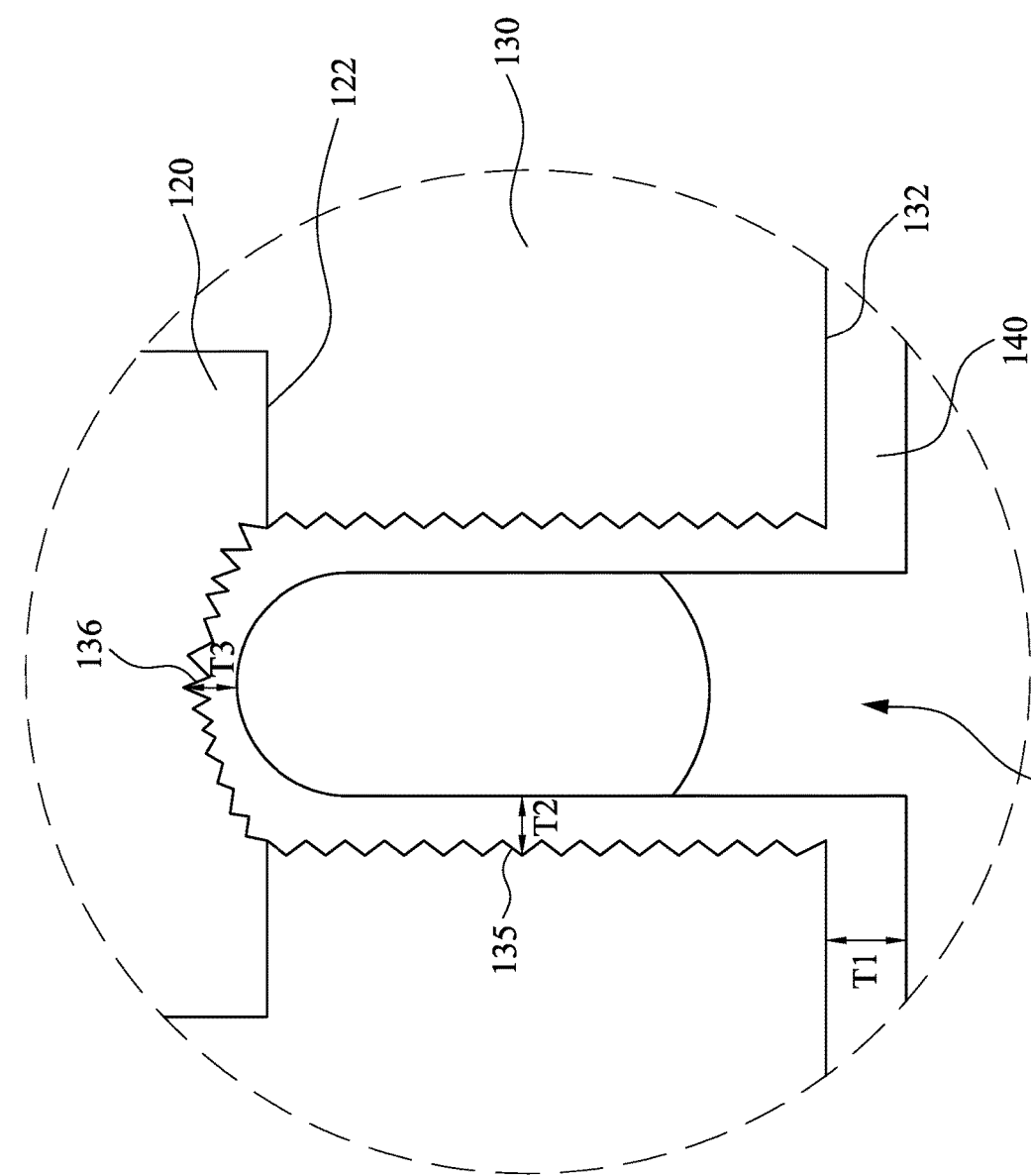
FIG. 3 illustrates an enlarge view of a portion of the chip package in FIG. 2.

FIG. 3 illustrates an enlarge view of a portion of the chip package 100 in FIG. 2. As shown in FIG. 3, the laser stop structure 120 acts as the terminal of the laser when the laser is applied to form the second through hole 134. Even though a portion of the laser stop structure 120 is removed by the laser, but the laser is not able to penetrate the laser stop structure 120. In addition, sidewalls 135 and a bottom 136 of the second though hole 134 are rough surfaces since the second through hole 134 is formed by the laser, and the laser stop structure 120 is exposed at the bottom 136 of the second through hole 134.

After forming the second through hole 134, the conductive layer 140 is formed on the third surface 132 of the first isolation layer 130. The conductive layer 140 is further extended to cover the sidewalls 135 and the bottom 136 of the second through hole 134, so as the conductive layer 140 is electrically connected to the laser stop structure 120. The conductive layer 140 has a thickness T1 above the third surface 132 of the first isolation layer 130, a thickness T2 on the sidewalls 135 of the second through hole 134, and a thickness T3 on the bottom 136 of the second through hole 134. Since the conductive layer 140 is formed by electroplating, the thickness T1 is greater than the thickness T2, and the thickness T2 is greater than the thickness T3.

Figure 4:
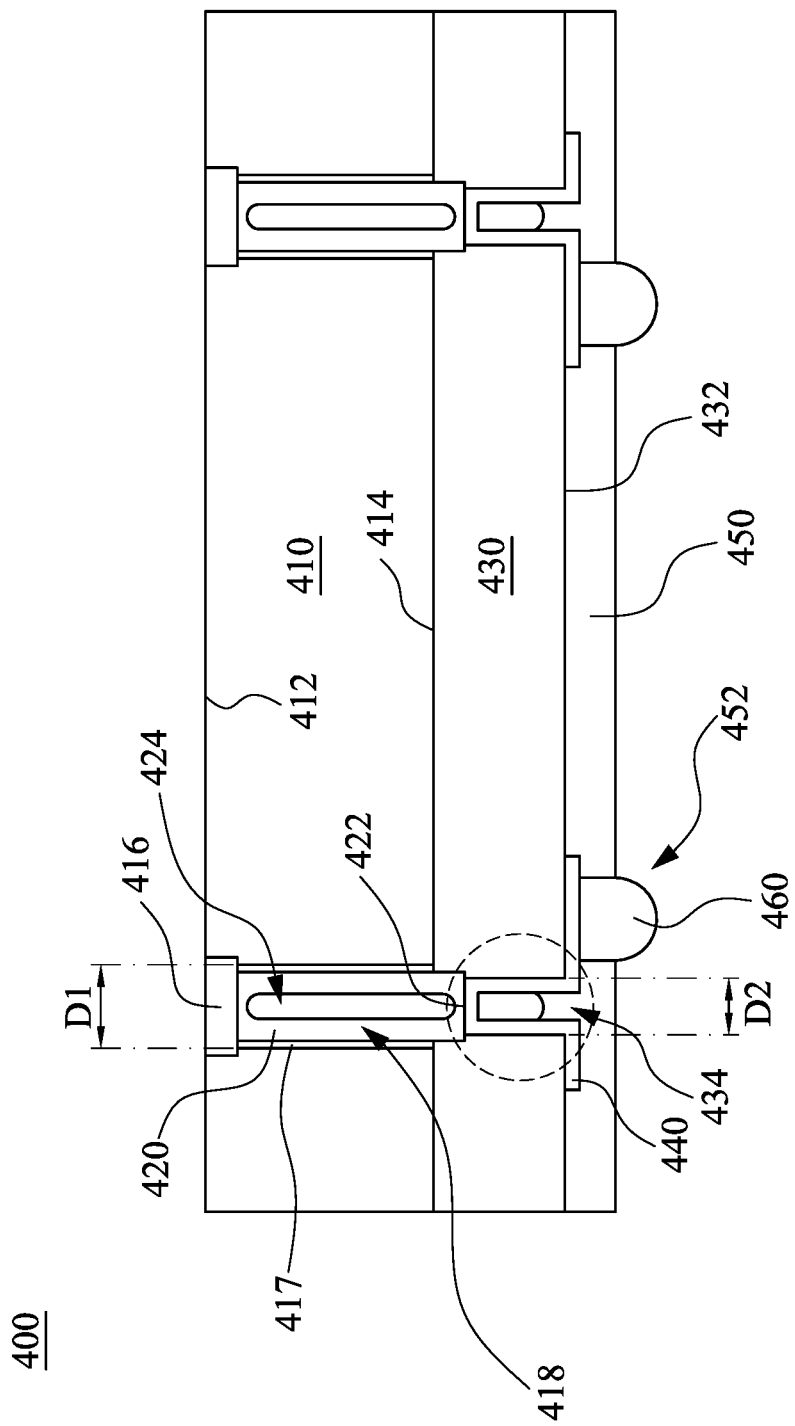
FIG. 4 illustrates a cross-sectional view of the chip package in FIG. 1 along the line A-A, according to various embodiments of the present disclosure.

Referring now to FIG. 4. FIG. 4 illustrates a cross-sectional view of the chip package in FIG. 1 along the line A-A, according to various embodiments of the present disclosure. It should be noticed that the materials of the same elements are not described herein.

As shown in FIG. 4, a chip package 400 includes a chip 410, a laser stop structure 420, a first isolation layer 430, a conductive layer 440, a passivation layer 450 and an external conductive connection 460. The chip 410 is a sensor chip having a first surface 412 and a second surface 414 opposite to the first surface 412, which the first surface 412 acts as a sensing surface, and a conductive pad 416 is on the first surface 412 of the chip 410. The second surface 414 of the chip 410 has a first through hole 418 extending from the second surface 414 to the first surface 412 to expose the conductive pad 416. The laser stop structure 420 is in the first through hole 418 and on the conductive pad 416, and an upper surface 422 of the laser stop structure 420 is above the second surface 414. In some embodiments, the chip package 400 further includes a second isolation layer 417, which is disposed in the first through hole 418 to surround the laser stop structure 420, and the second isolation layer 417 includes silicon oxide, silicon nitride, silicon oxynitride or other suitable insulating materials. In various embodiments, the laser stop structure 420 in FIG. 4 is a hollow structure, which means that the first through hole 418 is not fully filled by the laser stop structure 420, and a void 424 is existed in the laser stop structure 420.

Continuing in FIG. 4, the first isolation layer 430 is on the second surface 414 to cover the laser stop structure 420, which the first isolation layer 430 includes epoxy. The first isolation layer 430 has a third surface 432 opposite to the second surface 414, and a second though hole 434 is extended from the third surface 432 to the second surface 414 to expose the laser stop structure 420. The second though hole 434 is a laser through hole. Specifically, a laser is applied for penetrating the first isolation layer 430 to form the second through hole 434, and the laser stop structure 420 acts as a terminal of the laser. By applying the laser, a hole diameter D2 of the second through hole 434 is less than the hole diameter D1 of the first through hole 418, and it is benefit for miniaturization design. In some embodiments, the second through hole 434 only exposes the laser stop structure 420.

Continuing in FIG. 4, the conductive layer 440 is on the third surface 432 of the first isolation layer 430, and a portion of the conductive layer 440 is extended into the second through hole 434 to contact the laser stop structure 420, which is exposed by the second through hole 434. The passivation layer 450 covers the third surface 432 and the conductive layer 440, and the passivation layer 450 has an opening 452 exposing the conductive layer 440. In addition, the external conductive connection 460 is in the opening 452 and in contact with the conductive layer 440. Therefore, the external conductive connection 460 is electrically connected to the conductive pad 416 via the conductive layer 440 and the laser stop structure 420.

In some embodiments, the chip package 400 is a finger print sensor or a RF sensor, but not limited thereto.

Figure 5:
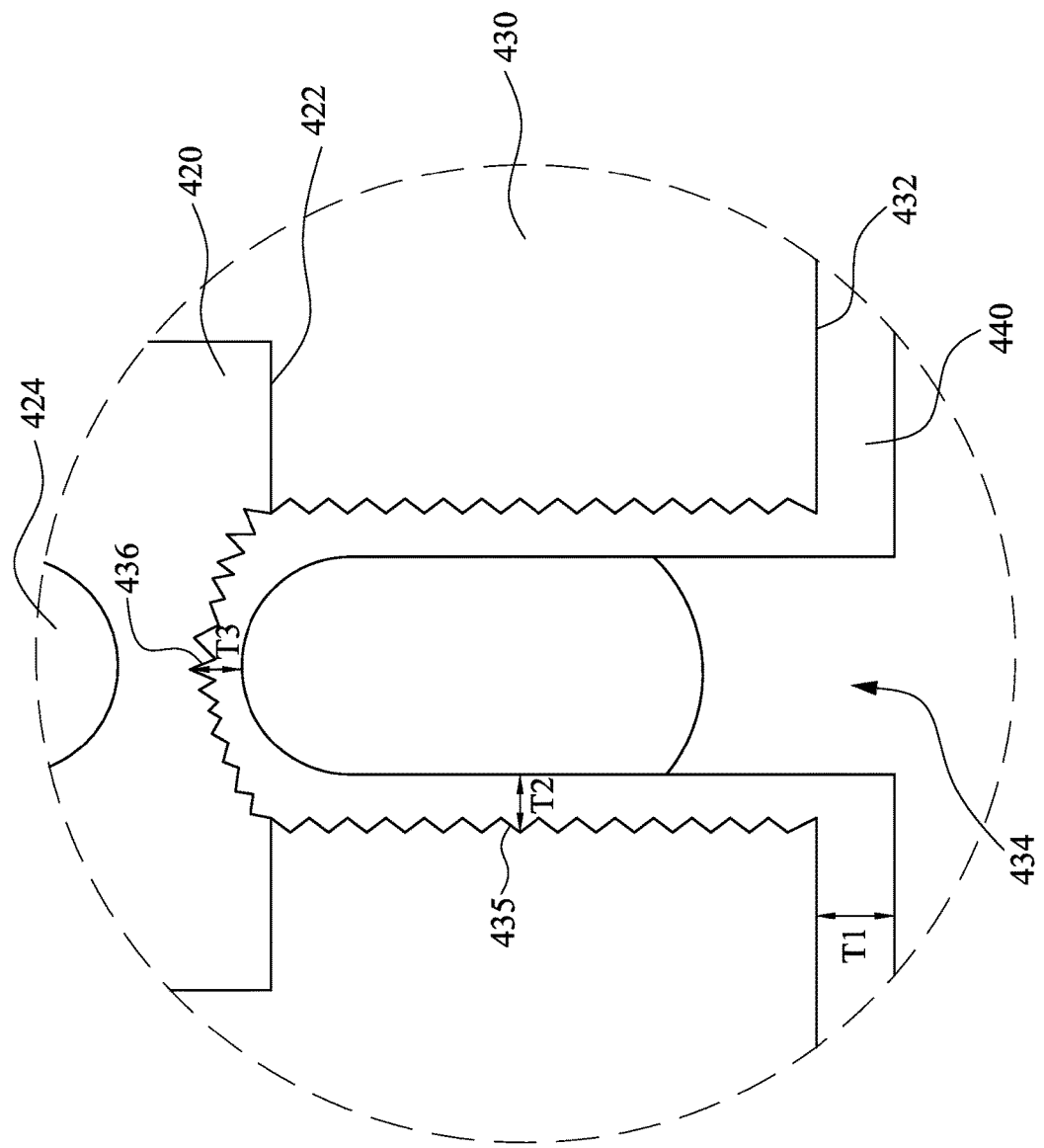
FIG. 5 illustrates an enlarge view of a portion of the chip package in FIG. 4.

FIG. 5 illustrates an enlarge view of a portion of the chip package 400 in FIG. 4. As shown in FIG. 5, the laser stop structure 420 acts as the terminal of the laser when the laser is applied to form the second through hole 434. Even though a portion of the laser stop structure 420 is removed by the laser, but the laser is not able to penetrate the laser stop structure 420. In addition, sidewalls 435 and a bottom 436 of the second though hole 434 are rough surfaces since the second through hole 434 is formed by the laser, and the laser stop structure 420 is exposed at the bottom 436 of the second through hole 434.

After forming the second through hole 434, the conductive layer 440 is formed on the third surface 432 of the first isolation layer 430. The conductive layer 440 is further extended to cover the sidewalls 435 and the bottom 436 of the second through hole 434, so as the conductive layer 440 is electrically connected to the laser stop structure 420. The conductive layer 440 has a thickness T1 above the third surface 432 of the first isolation layer 430, a thickness T2 on the sidewalls 435 of the second through hole 434, and a thickness T3 on the bottom 436 of the second through hole 434. Since the conductive layer 440 is formed by electroplating, the thickness T1 is greater than the thickness T2, and the thickness T2 is greater than the thickness T3.

Figure 6:
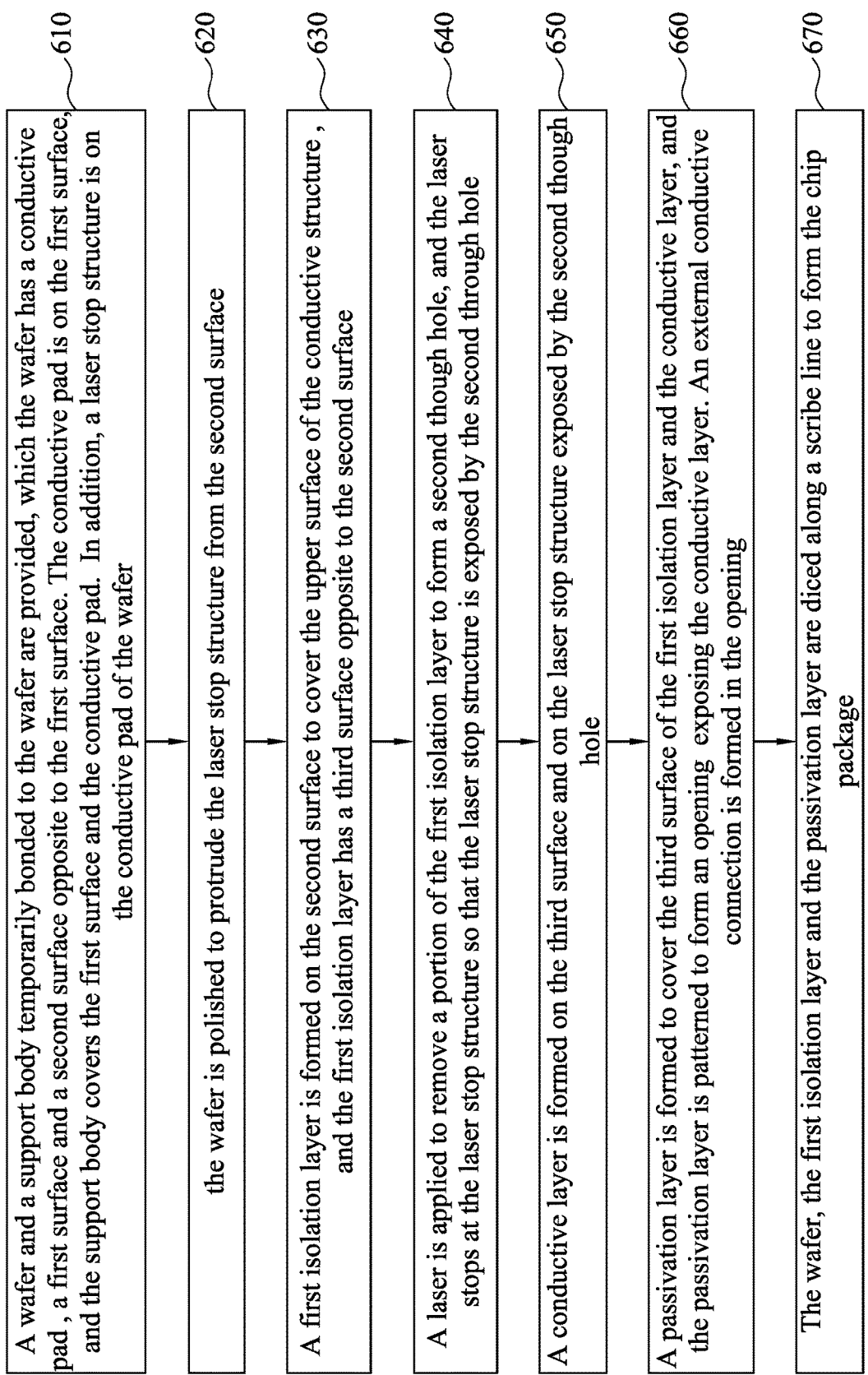
FIG. 6 illustrates a flow chart of a method of fabricating the chip package, in accordance with various embodiments.

Referring to FIG. 6, FIG. 6 illustrates a flow chart of a method of fabricating the chip package, in accordance with various embodiments. Refer to FIGS. 7A to 7G at the same time to further understand the method of fabricating the chip package, which FIGS. 7A to 7G are cross-sectional views of the chip package in FIG. 2 at intermediate stages of fabrication, in accordance with various embodiments.

Figure 7A:
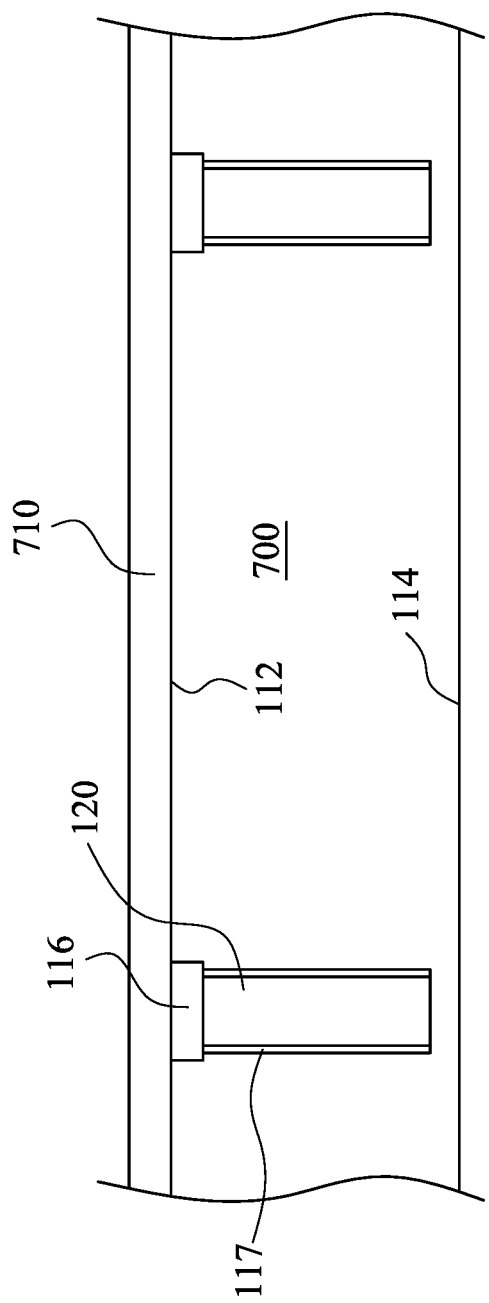

Refer to step 610 and FIG. 7A, a wafer 700 and a support body 710 temporarily bonded to the wafer 700 are provided, which the wafer 700 has a conductive pad 116, a first surface 112 and a second surface 114 opposite to the first surface 112. The conductive pad 116 is on the first surface 112, and the support body 710 covers the first surface 112 and the conductive pad 116. In addition, a laser stop structure 120 is on the conductive pad 116 of the wafer 700. The wafer 700 is a semiconductor substrate, which means that a plurality of chips 110 shown in FIG. 2 are formed by dicing the wafer 700, and the support body 710 provides support force in the subsequent process to prevent external force cracking the wafer 700. In this embodiment, the wafer 700 is provided with the laser stop structure 120 therein, and a second isolation layer 117 surrounds the laser stop structure 120. It is should be noted that, although the laser stop structure 120 illustrated in FIG. 7A is a solid structure, but the disclosure is not limited thereto. In various embodiments, the laser stop structure 120 is a hollow structure.

Figure 7B:
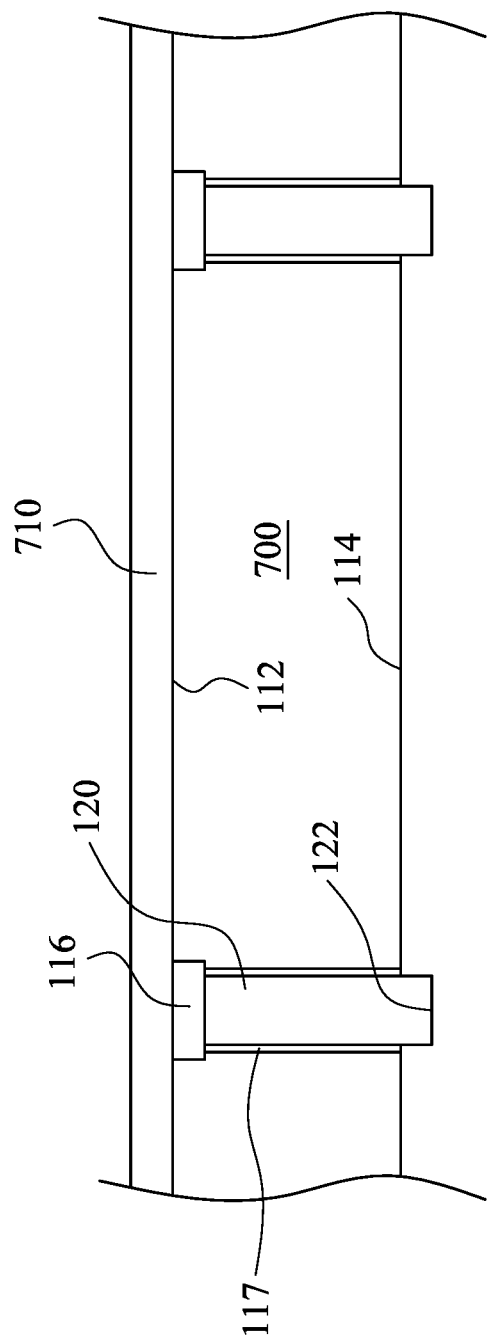

Continuing in step 620 and FIG. 7B, the wafer 700 is polished to protrude the laser stop structure 120 from the second surface 114. Described in different ways, the wafer 700 is thinned so that the second surface 114 of the wafer 700 is lower than an upper surface 122 of the laser stop structure 120. In this step, the second surface 114 of the wafer 700 is polished to reduce a thickness of the wafer 700. However, the laser stop structure 120 is not polished since the laser stop structure 120 has greater hardness than that of the wafer 700. Therefore, the laser stop structure 120 is gradually protruded from the second surface 114, so as to expose the upper surface 122 of the laser stop structure 120.

Figure 7C:
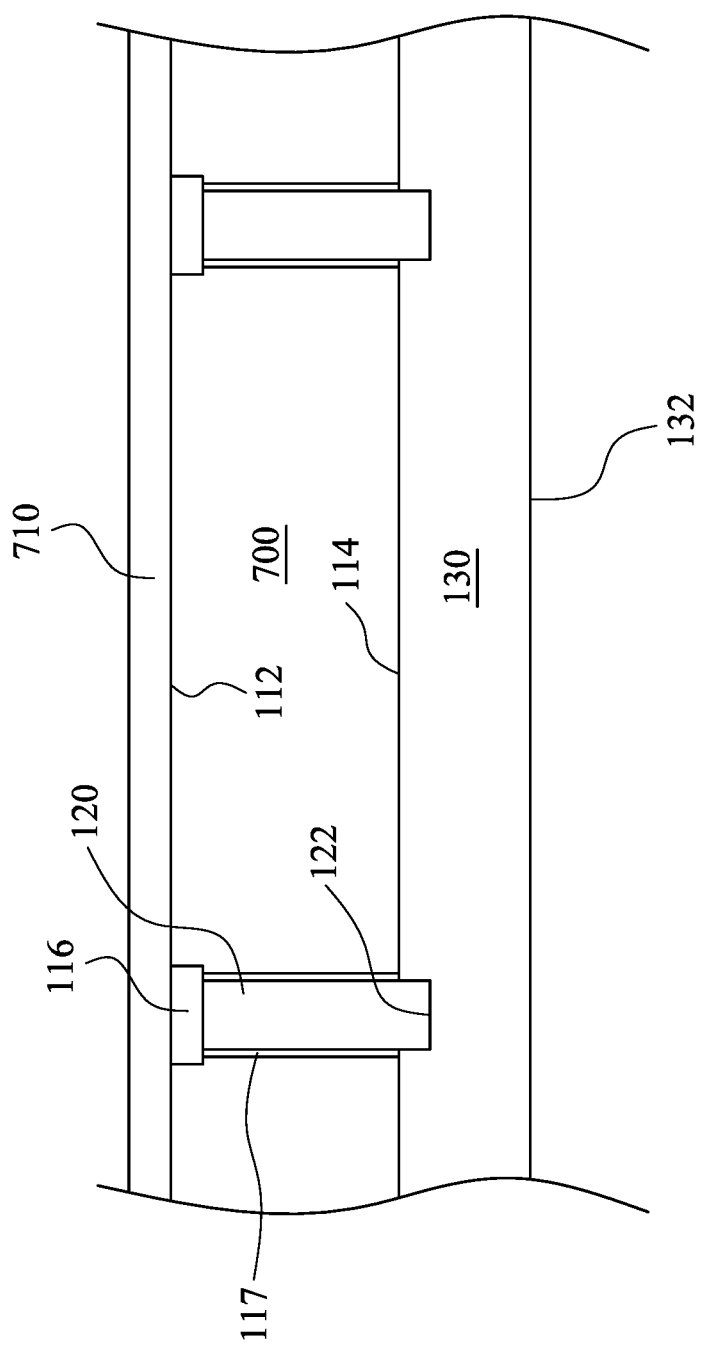

Refer now to step 630 and FIG. 7C, a first isolation layer 130 is formed on the second surface 114 to cover the upper surface 122 of the conductive structure 120, and the first isolation layer 130 has a third surface 132 opposite to the second surface 114. In this step, an epoxy is printed or coated on the second surface 114 of the wafer 700, so as to form the first isolation layer 130 covering the laser stop structure 120 protruded from the second surface 114. In some embodiments, the third surface 132 of the first isolation layer 130 is further coated, imprinted, molded or polished to reduce a thickness of the first isolation layer 130 after forming the first isolation layer 130. In some embodiments, the first isolation layer 130 formed on the second surface 114 by printing or coating.

Figure 7D:
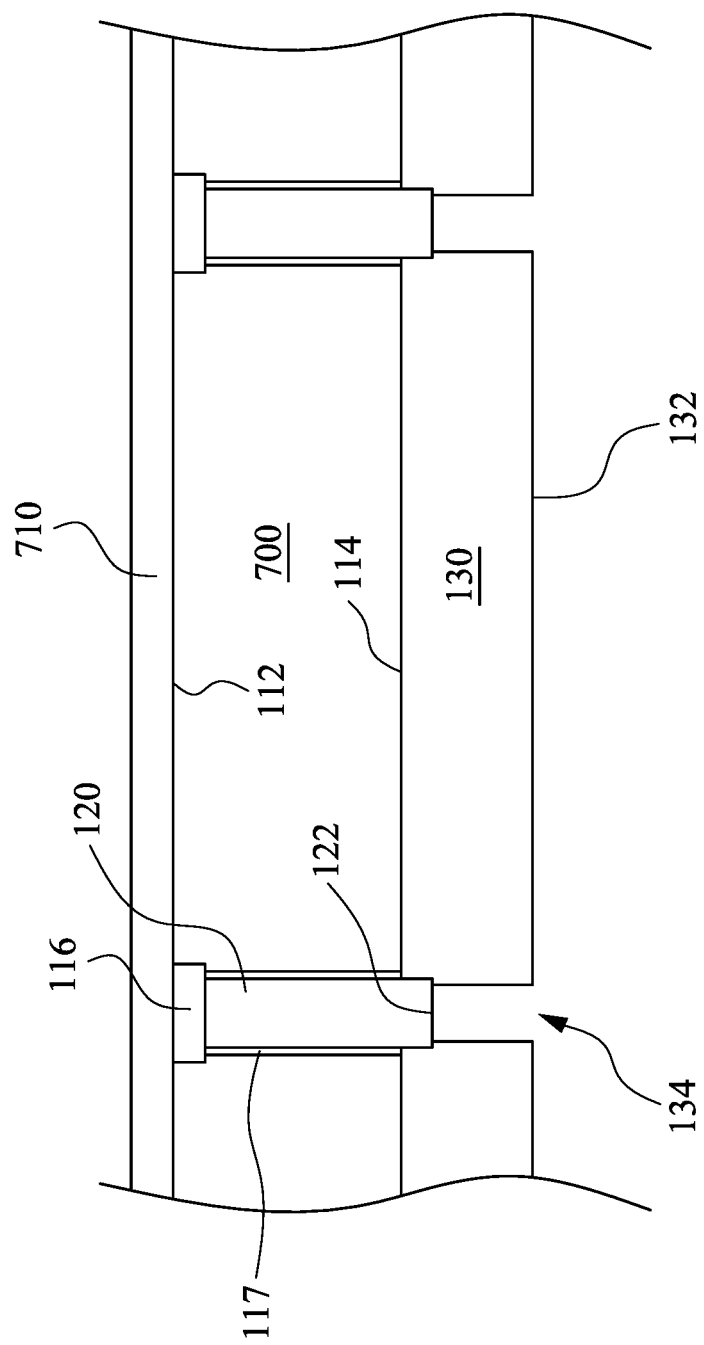

Continuing in step 640 and FIG. 7D, a laser is applied to remove a portion of the first isolation layer 130 to form a second though hole 134, and the laser stops at the laser stop structure 120 so that the laser stop structure 120 is exposed by the second through hole 134. In this step, the laser is aligned to the upper surface 122 of the laser stop structure 120 for penetrating the first isolation layer 130 above the upper surface 122 of the laser stop structure 120. However, the laser is not able to penetrate the laser stop structure 120, which acts as a terminal of the laser, and the upper surface 122 of the laser stop structure 120 is exposed by the second through hole 134.

Continuing in step 650 and FIG. 7E, a conductive layer 140 is formed on the third surface 132 and on the laser stop structure 120 exposed by the second though hole 134. After forming the second through hole 134 in the first isolation layer 130, a conductive material is deposited on the third surface 132 of the first isolation layer 130, sidewalls of the second through hole 134 and the laser stop structure 120 exposed by the second through hole 134, so as to form the conductive layer 140, which the conductive material is deposited by using electroless plating method in combination with electroplating method.

Figure 7F:
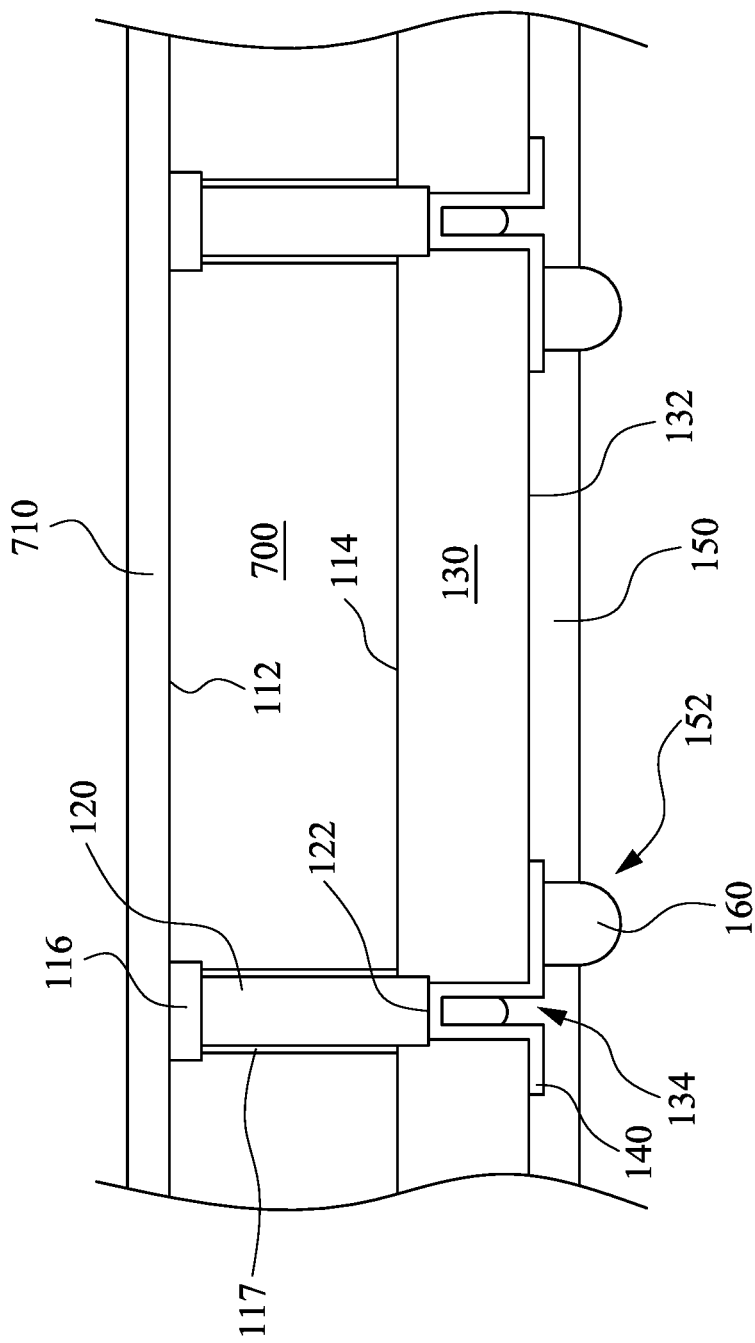

Continuing in step 660 and FIG. 7F, a passivation layer 150 is formed to cover the third surface 132 of the first isolation layer 130 and the conductive layer 140, and the passivation layer 150 is patterned to form an opening 152 exposing the conductive layer 140. Then, an external conductive connection 160 is formed in the opening 152. Insulating material is brush-coated on the third surface 132 of the first isolation layer 130 and on the conductive layer 140, so as to form the passivation layer 150, and the insulating material includes epoxy. After that, the passivation layer 150 is patterned to form the opening 152 so that a portion of the conductive layer 140 is exposed by the opening 152 of the passivation layer 150, and the external conductive connection 160 is formed in the opening 152. As such, the external conductive connection 160 is electrically connected to the conductive pad 116 via the conductive layer 140 and the laser stop structure 120.

In some embodiments, the support body 710 covering the first surface 112 of the wafer 700 is removed after forming the passivation layer 150. In some embodiments, the support body 710 covering the first surface 112 of the wafer 700 is removed after forming the external conductive connection 160.

Figure 7G:
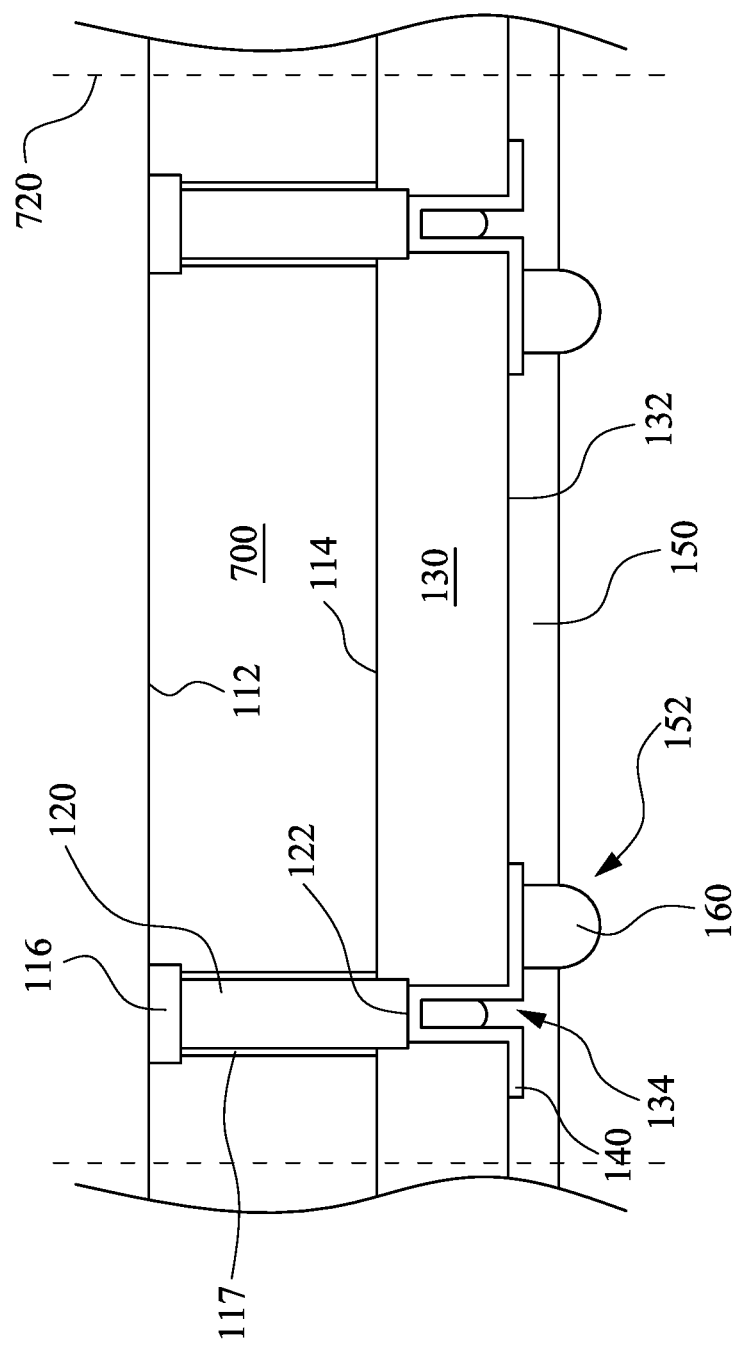

Continuing in step 670 and FIG. 7G, the wafer 700, the first isolation layer 130 and the passivation layer 150 are diced along a scribe line 720 to form the chip package 100. The wafer 700 is diced alone the scribe line 720 to separate the chips on the wafer, so as to form the chip package 100 shown in FIG. 2.

Refer to FIGS. 8A to 8I to further understand a method of fabricating the chip package in accordance with various embodiments of the present disclosure. FIGS. 8A to 8I are cross-sectional views of the chip package in FIG. 4 at intermediate stages of fabrication, in accordance with various embodiments.

Figure 8A:
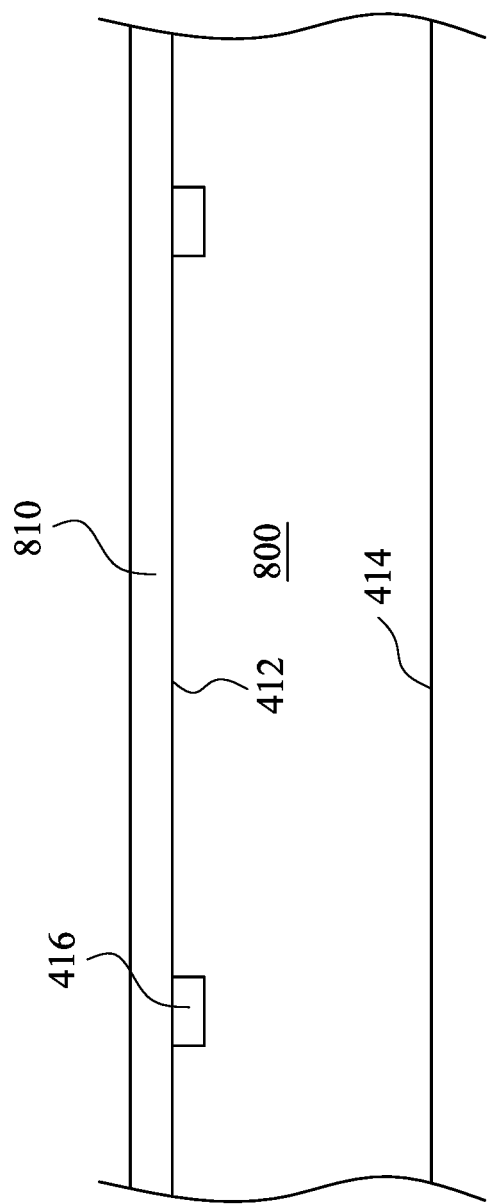
FIGS. 8A to 8I are cross-sectional views of the chip package in FIG. 4 at intermediate stages of fabrication, in accordance with various embodiments.

Refer to FIG. 8A, a wafer 800 and a support body 810 temporarily bonded to the wafer 800 are provided, which the wafer 800 has a conductive pad 416, a first surface 412 and a second surface 414 opposite to the first surface 412. The conductive pad 416 is on the first surface 412, and the support body 810 covers the first surface 412 and the conductive pad 416. The wafer 800 is a semiconductor substrate, which means that a plurality of chips 410 shown in FIG. 4 are formed by dicing the wafer 800, and the support body 810 provides support force in the subsequent process to prevent external force cracking the wafer 800. In this embodiment, the wafer 800 is provided without the laser stop structure therein, which is formed in the wafer 800 in the subsequent process.

Figure 8B:
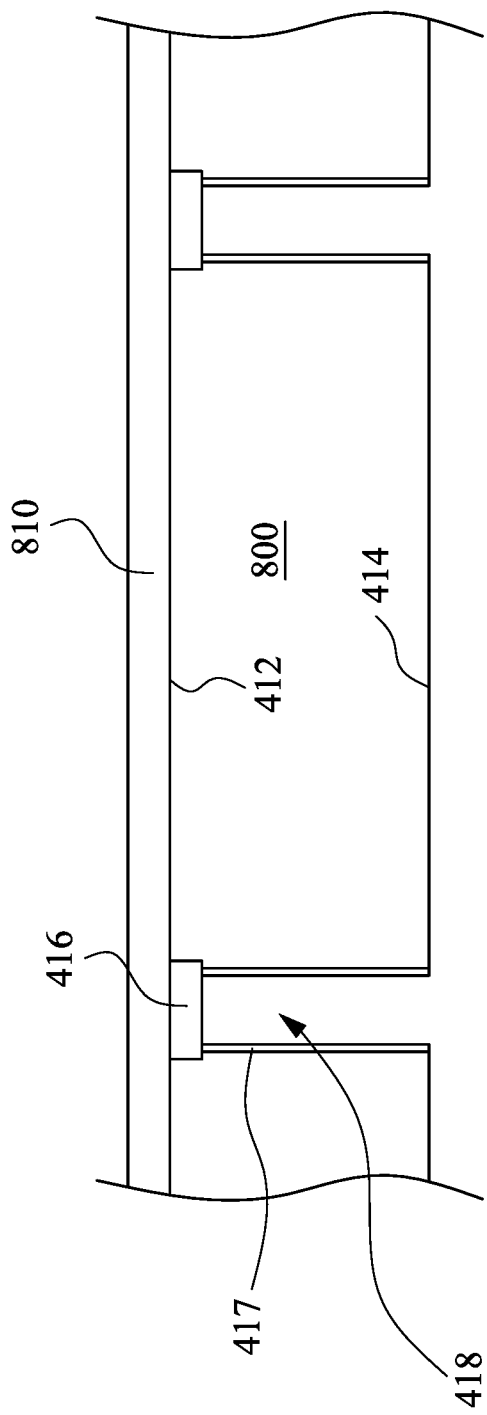

In FIG. 8B, a first though hole 418 is formed extending from the second surface 414 to the first surface 412 to expose the conductive pad 416. The first through hole 418 may be formed by, for example, photolithography etching, but not limited thereto. In some embodiments, after forming the first through hole 418, an insulating material is further deposited to cover sidewalls and a bottom of the first through hole 418, and the insulating material at the bottom of the first through hole 418 is removed by photolithography etching to form the second isolation layer 417. Therefore, the conductive pad 416 is exposed by the first through hole 418.

Figure 8C:
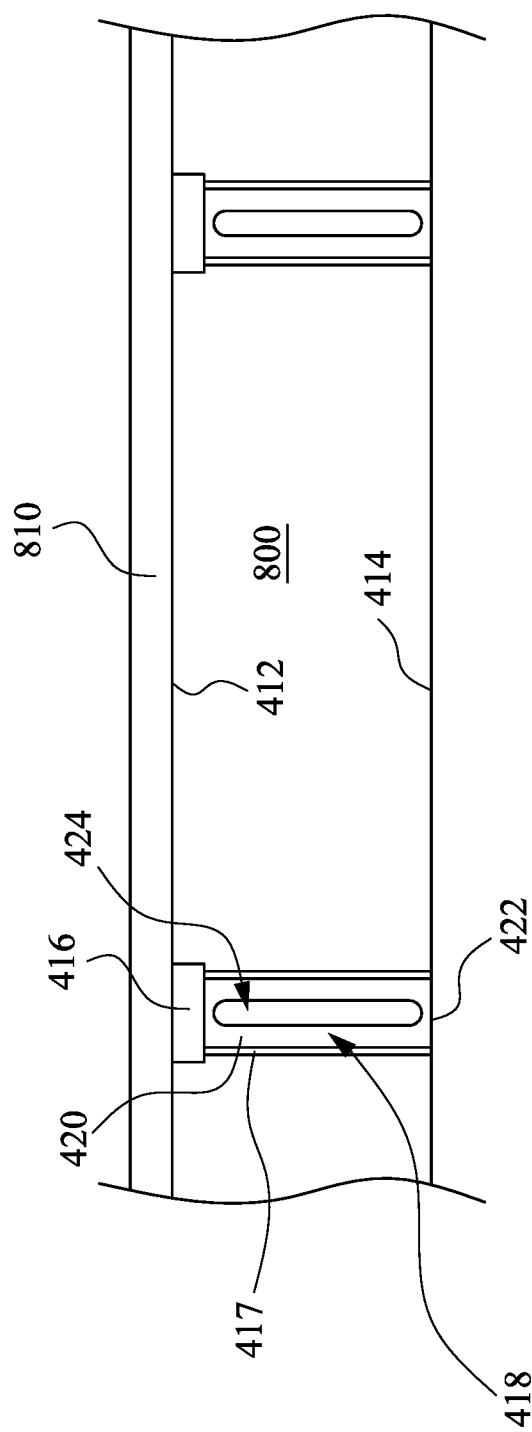

Continuing in FIG. 8C, a laser stop structure 420 is formed in the first through hole 418, which the laser stop structure 420 is on the conductive pad 418. In this step, sputtering, evaporating, electroplating or electroless plating techniques may be applied for depositing a conductive material to form the laser stop structure 420. In this embodiment, the first through hole 418 is not fully filled by the laser stop structure 420, and a void 424 is existed in the laser stop structure 420. It is should be noted that, although the laser stop structure 420 illustrated in FIG. 8C is a hollow structure, but the disclosure is not limited thereto. In various embodiments, the laser stop structure 420 is a solid structure. In some embodiments, an upper surface 422 of the laser stop structure 420 may be lower than the second surface 414 of the wafer 800. Alternatively, the upper surface 422 and the second surface 414 may be coplanar as shown in FIG. 8C.

Figure 8D:
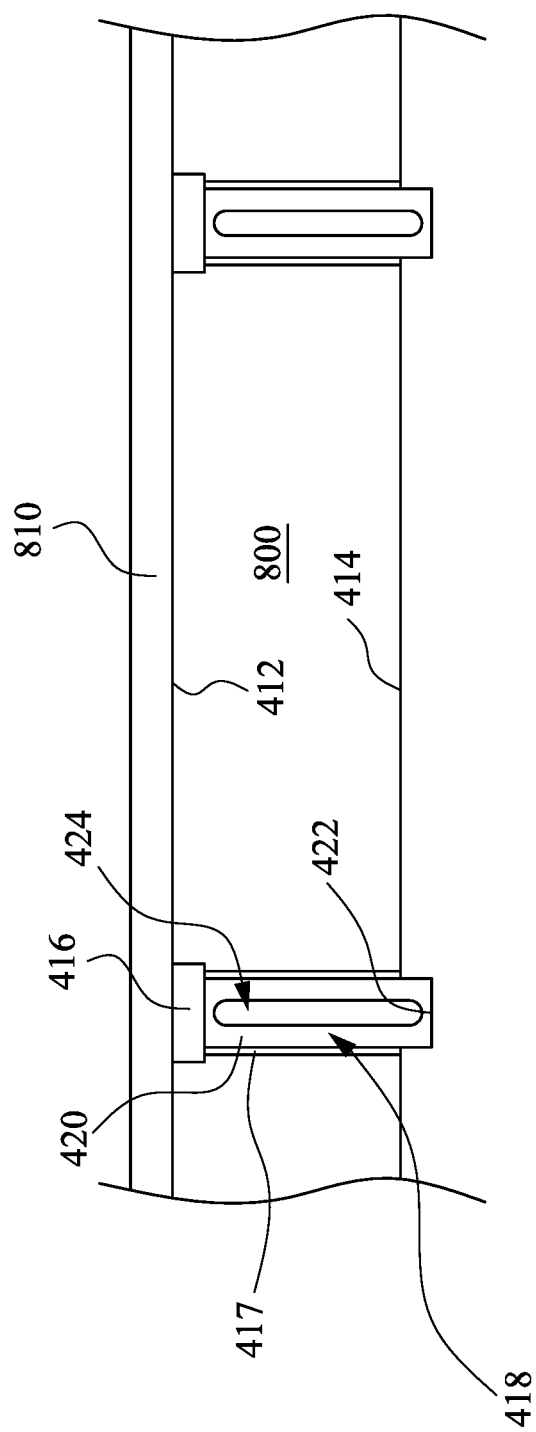

Continuing in FIG. 8D, the wafer 800 is polished to protrude the laser stop structure 420 from the second surface 414. Described in different ways, the wafer 800 is thinned so that the second surface 414 of the wafer 800 is lower than the upper surface 422 of the laser stop structure 420. In this step, the second surface 414 of the wafer 800 is polished to reduce a thickness of the wafer 800. However, the laser stop structure 420 is not polished since the laser stop structure 420 has greater hardness than that of the wafer 800. Therefore, the laser stop structure 420 is gradually protruded from the second surface 414, so as to expose the upper surface 422 of the laser stop structure 420. In addition, a portion of the second isolation layer 417 is removed when polishing the second surface 414 of the wafer 800.

Figure 8E:
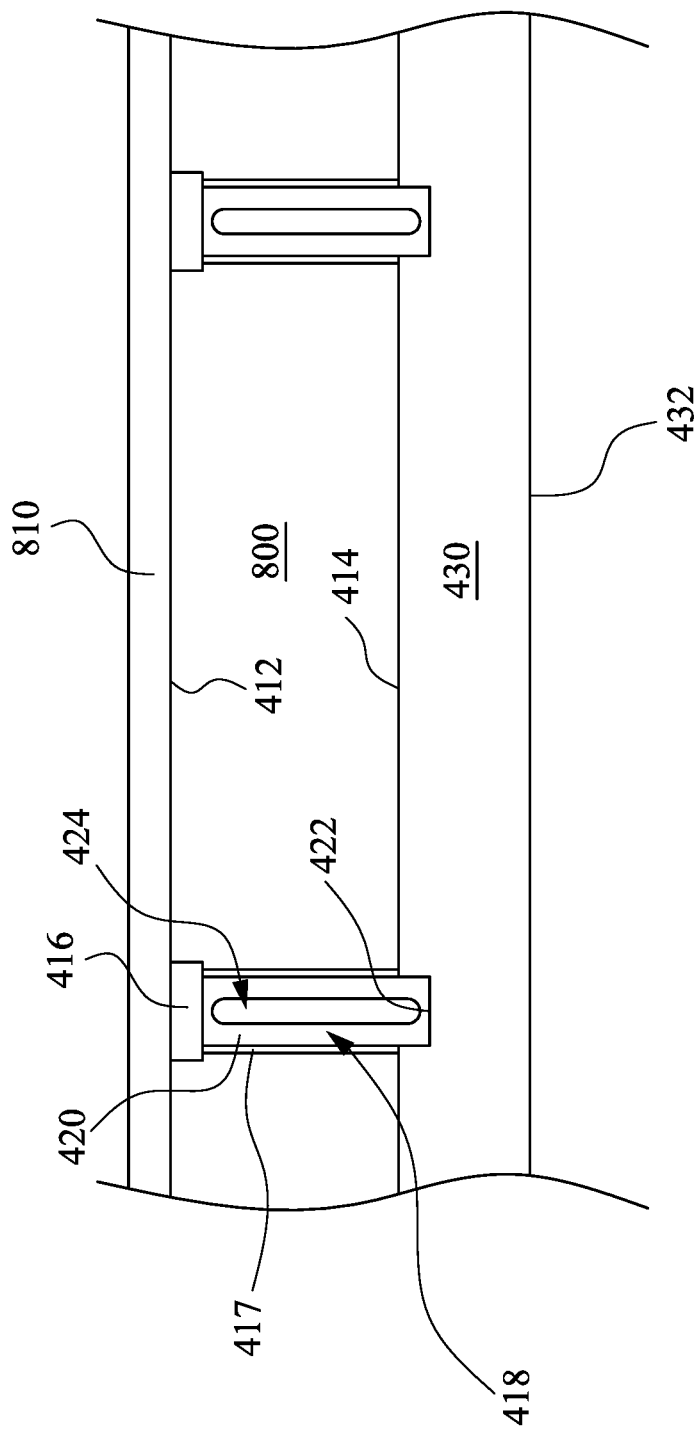

Refer now to FIG. 8E, a first isolation layer 430 is formed on the second surface 414 to cover the upper surface 422 of the conductive structure 420, and the first isolation layer 430 has a third surface 432 opposite to the second surface 414. In this step, an epoxy is printed or coated on the second surface 414 of the wafer 800, so as to form the first isolation layer 430 covering the laser stop structure 420 protruded from the second surface 414. In some embodiments, the third surface 432 of the first isolation layer 430 is further coated, imprinted, molded or polished to reduce a thickness of the first isolation layer 430 after forming the first isolation layer 430.

Figure 8F:
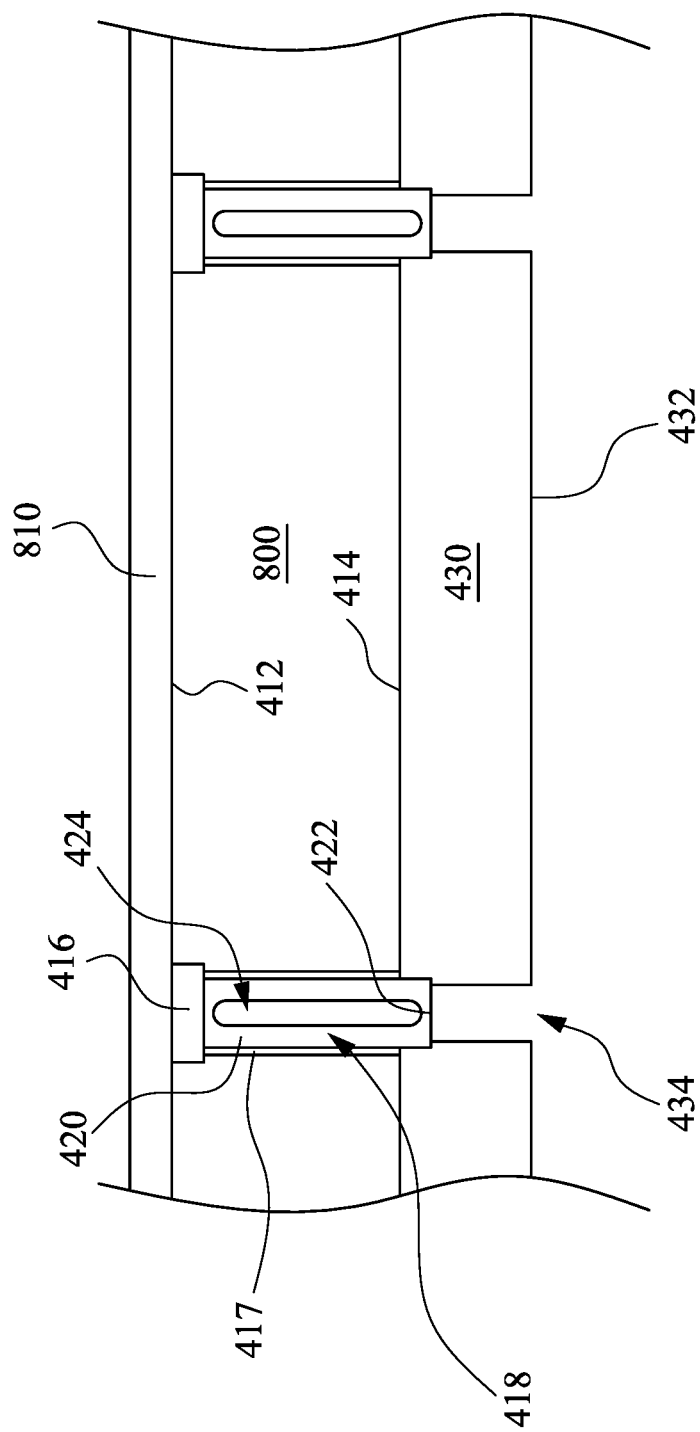

Continuing in FIG. 8F, a laser is applied to remove a portion of the first isolation layer 430 to form a second though hole 434, and the laser stops at the laser stop structure 420 so that the laser stop structure 420 is exposed by the second through hole 434. In this step, the laser is aligned to the upper surface 422 of the laser stop structure 420 for penetrating the first isolation layer 430 above the upper surface 422. However, the laser is not able to penetrate the laser stop structure 420, which acts as a terminal of the laser, and the upper surface 422 of the laser stop structure 420 is exposed by the second through hole 434. In some embodiments, the second through hole 434 only exposes the upper surface 422 of the laser stop structure 420.

Figure 8G:
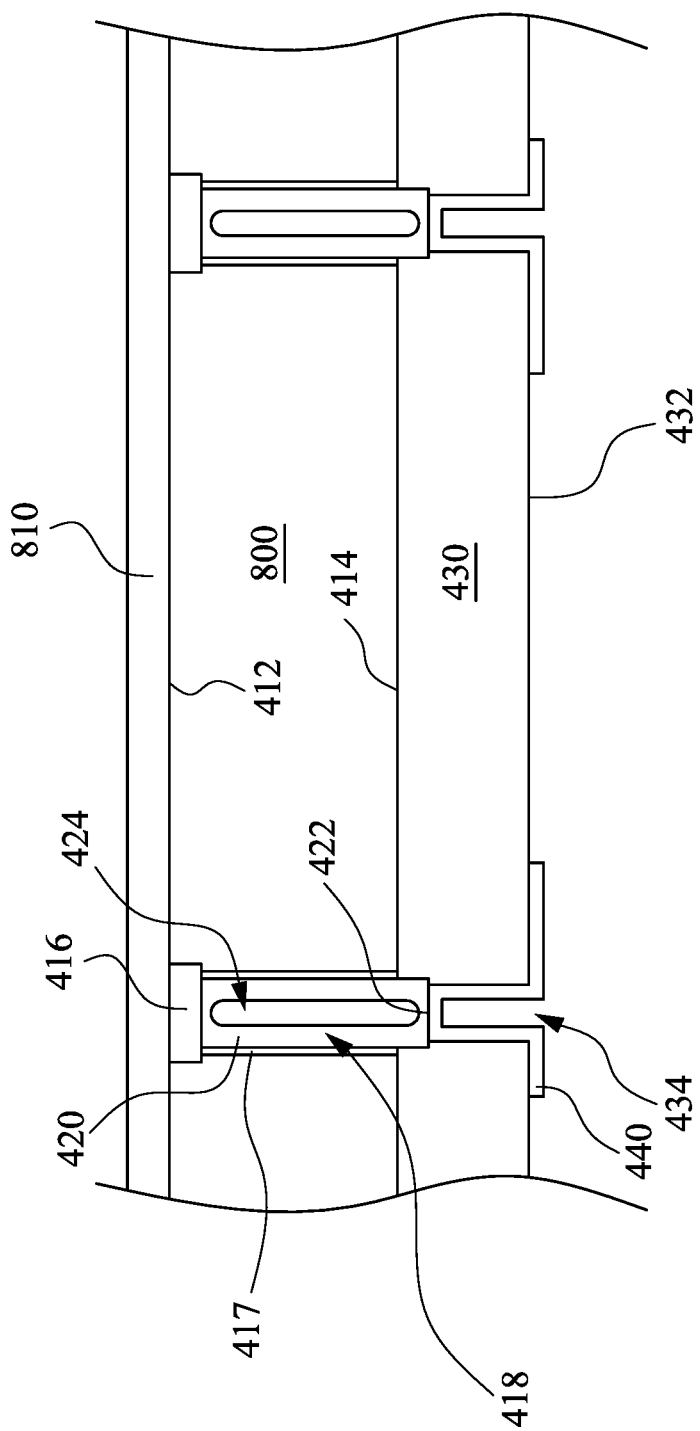

Continuing in step 650 and FIG. 8G, a conductive layer 440 is formed on the third surface 432 and on the laser stop structure 420 exposed by the second though hole 434. After forming the second through hole 434 in the first isolation layer 430, a conductive material is deposited on the third surface 432 of the first isolation layer 430, sidewalls of the second through hole 434 and the laser stop structure 420 exposed by the second through hole 434, so as to form the conductive layer 440, which the conductive material is deposited by using electroless plating method in combination with electroplating method.

Figure 8H:
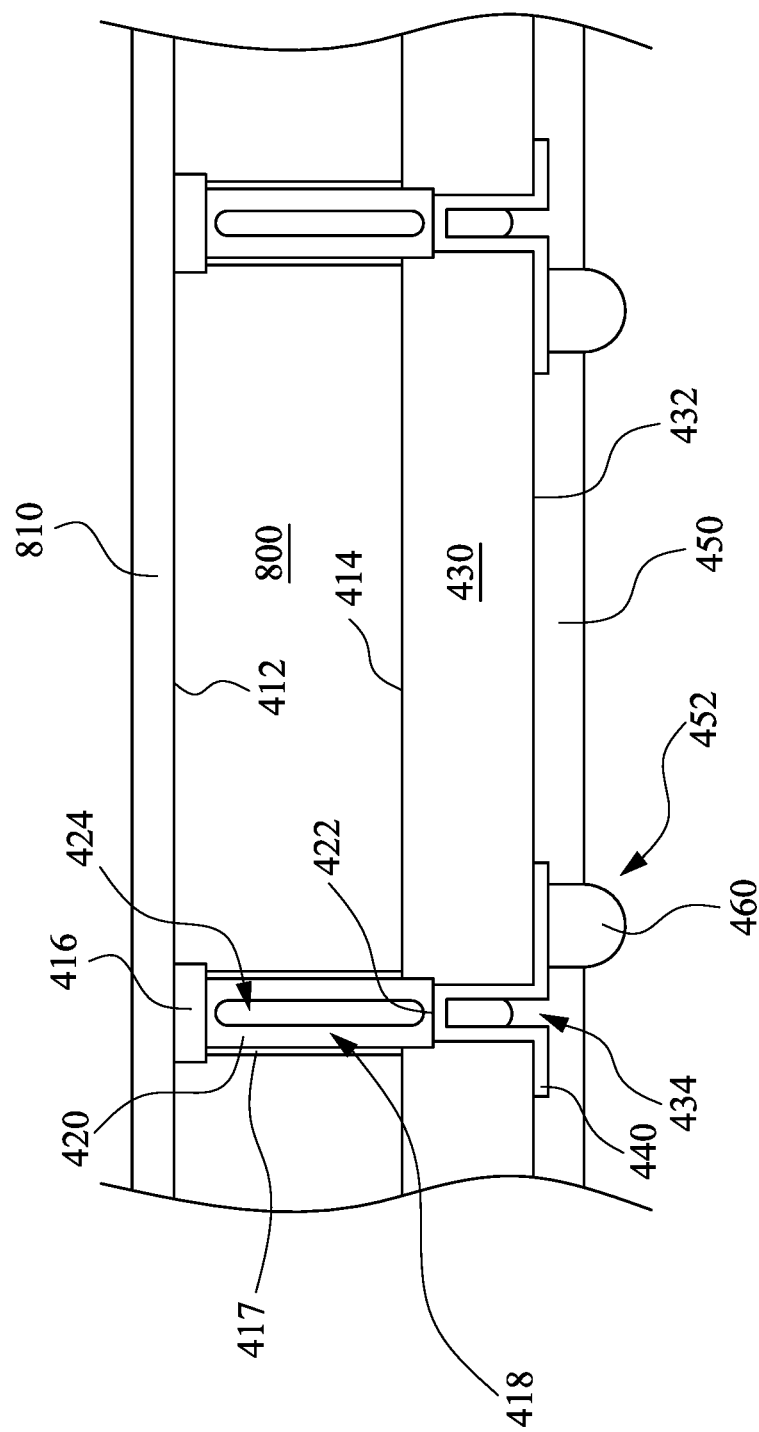

Continuing in FIG. 8H, a passivation layer 450 is formed to cover the third surface 432 of the first isolation layer 430 and the conductive layer 440, and the passivation layer 450 is patterned to form an opening 452 exposing the conductive layer 440. Then, an external conductive connection 460 is formed in the opening 452. Insulating material is brush-coated on the third surface 432 of the first isolation layer 430 and on the conductive layer 440, so as to form the passivation layer 450, and the insulating material includes epoxy. After that, the passivation layer 450 is patterned to form the opening 452 so that a portion of the conductive layer 440 is exposed by the opening 452 of the passivation layer 450, and the external conductive connection 460 is formed in the opening 452. As such, the external conductive connection 460 is electrically connected to the conductive pad 416 via the conductive layer 440 and the laser stop structure 420.

In some embodiments, the support body 810 covering the first surface 412 of the wafer 800 is removed after forming the passivation layer 450. In some embodiments, the support body 710 covering the first surface 412 of the wafer 800 is removed after forming the external conductive connection 460.

Figure 8I:
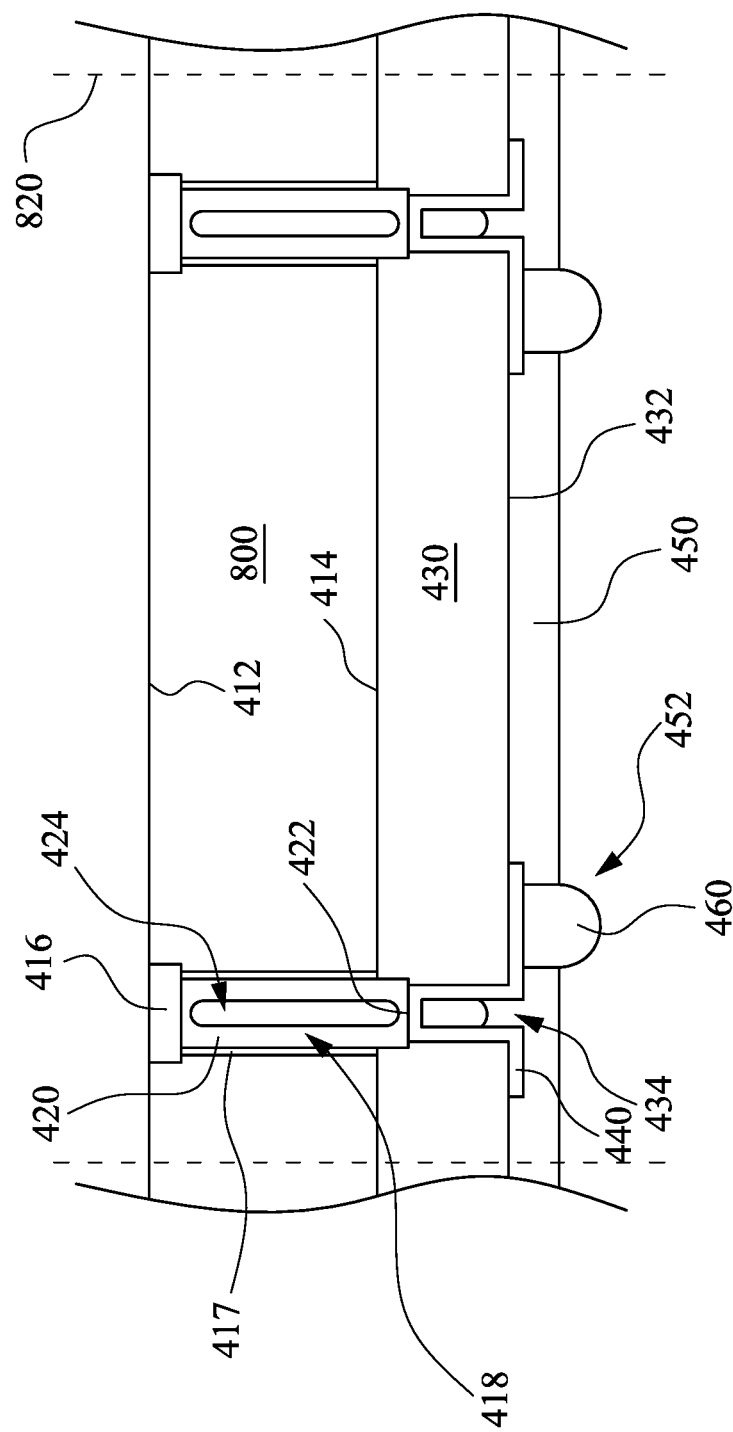

Continuing in FIG. 8I, the wafer 800, the first isolation layer 830 and the passivation layer 450 are diced along a scribe line 820 to form the chip package 400. The wafer 800 is diced alone the scribe line 820 to separate the chips on the wafer, so as to form the chip package 400 shown in FIG. 4.

The embodiments of the present disclosure discussed above have advantages over existing methods and structures, and the advantages are summarized below. The chip package and the fabrication method thereof omit the conventional processes of chemical vapor depositing the first isolation layer and patterning the first isolation layer. In addition, laser is applied to reduce a hole diameter of the through hole, which is benefit for miniaturization design, and further saves process time and machine costs. On the other hand, no additional process is applied on the first surface of the chip, which has excellent flatness to improve detecting accuracy of the chip package.

Although the present invention has been described in considerable detail with reference to certain embodiments thereof, other embodiments are possible. Therefore, the spirit and scope of the appended claims should not be limited to the description of the embodiments contained herein. Reference will now be made in detail to the embodiments of the invention, examples of which are illustrated in the accompanying drawings. Wherever possible, the same reference numbers are used in the drawings and the description to refer to the same or like parts.

What is claimed is:

1. A chip package, comprising:
  a chip having a conductive pad, a first surface and a second surface opposite to the first surface, and the conductive pad being on the first surface;
  a first though hole extending from the second surface to the first surface to expose the conductive pad;
  a laser stop structure disposed on the conductive pad exposed by the first through hole, and an upper surface of the laser stop structure being above the second surface;
  a first isolation layer covering the second surface and the laser stop structure, and the first isolation layer having a third surface opposite to the second surface;
  a second though hole extending from the third surface to the second surface to expose the laser stop structure; and
  a conductive layer on the third surface and extending into the second though hole to contact the laser stop structure.

2. The chip package of claim 1, further comprising:
  a passivation layer covering the third surface and the conductive layer, and the passivation layer having an opening exposing the conductive layer; and
  an external conductive connection in the opening and in contact with the conductive layer.

3. The chip package of claim 1, wherein a hole diameter of the second through hole is less than a hole diameter of the first through hole.

4. The chip package of claim 1, wherein the second through hole only exposes the laser stop structure.

5. The chip package of claim 1, wherein the laser stop structure is a solid structure or a hollow structure.

6. The chip package of claim 1, wherein a sidewall and a bottom of the second though hole are rough surfaces.

7. The chip package of claim 1, wherein the laser stop structure comprises copper.

8. The chip package of claim 1, wherein the first isolation layer comprises epoxy.

9. The chip package of claim 1, wherein a thickness of the conductive layer on the third surface of the first isolation layer is greater than a thickness of the conductive layer on a sidewall of the second through hole.

10. The chip package of claim 1, wherein a thickness of the conductive layer on a sidewall of the second through hole is greater than a thickness of the conductive layer on the laser stop structure.

* * * * *